(12) United States Patent
Tai et al.

(10) Patent No.: US 6,672,629 B2
(45) Date of Patent: Jan. 6, 2004

(54) MICROMACHINED FLUIDIC COUPLER AND METHOD OF MAKING THE SAME

(75) Inventors: Yu-Chong Tai, Pasadena, CA (US); Shuyun Wu, Pasadena, CA (US); Ellis Fan-chuin Meng, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/198,013

(22) Filed: Jul. 18, 2002

(65) Prior Publication Data

US 2002/0180212 A1 Dec. 5, 2002

Related U.S. Application Data

(62) Division of application No. 09/516,487, filed on Mar. 1, 2000, now Pat. No. 6,428,053.
(60) Provisional application No. 60/124,244, filed on Mar. 12, 1999.

(51) Int. Cl.[7] ................................................. F16L 17/00
(52) U.S. Cl. ..................................................... 285/342
(58) Field of Search ........................... 285/24, 342, 341, 285/343, 124.2, 124.3, 124.4, 332, 863.21; 73/863.21; 156/64

(56) References Cited

U.S. PATENT DOCUMENTS 4,508,367 A * 4/1985 Oreopoulos et al. .......... 285/24
5,667,255 A * 9/1997 Kato ........................... 285/332
5,890,745 A * 4/1999 Kovacs ......................... 285/24
6,056,331 A * 5/2000 Benett et al. ................ 285/343
6,186,556 B1 * 2/2001 Masuyama et al. ........... 285/24
6,240,790 B1 * 6/2001 Swedberg et al. ........ 73/863.21
6,290,791 B1 * 9/2001 Shaw et al. .................... 156/64
6,428,053 B1 * 8/2002 Tai et al. ....................... 285/24

* cited by examiner

Primary Examiner—Christopher P. Schwartz
Assistant Examiner—Melanie Torres
(74) Attorney, Agent, or Firm—Daniel L. Dawes; Myers Dawes Andras & Sherman LLP

(57) ABSTRACT

A micromachined coupler for coupling a capillary having a first size to an orifice having a shape and a second size, has a body which has a shape conforming the shape of the cavity into which the body must fit. A through hole is defined through the body. The through hole has a size conforming to the first size of the capillary. The capillary is disposable into the through hole so that the capillary is communicated to the orifice without the first and second sizes necessarily being the same. The cavity and the body have conforming slanting surfaces, and in particular the cavity and the body define truncated pyramidal shapes. The cavity and the body each have a truncated pyramidal shape. The pyramidal shape may be square, triangular, or conical. A method of fabricating the micromachined coupler is achieved either by micromaching or micromolding.

14 Claims, 8 Drawing Sheets

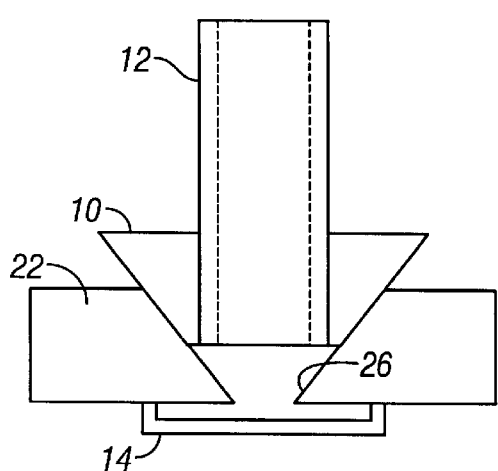
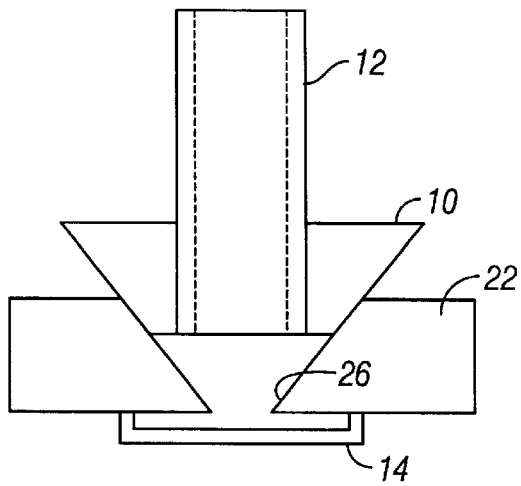
FIG. 5A            FIG. 5B
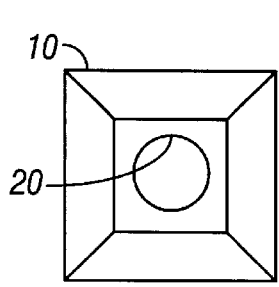
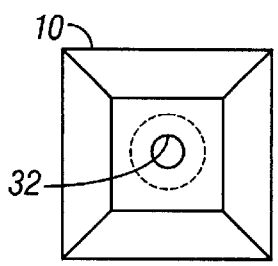
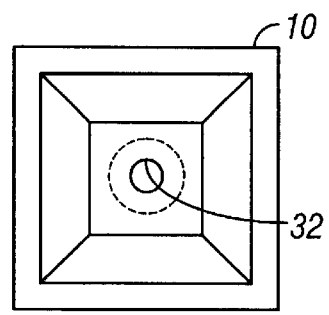
FIG. 6A'    FIG. 6B'    FIG. 6C'
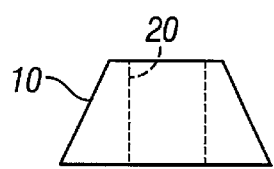
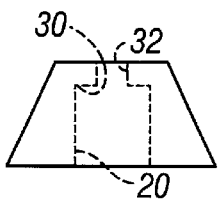
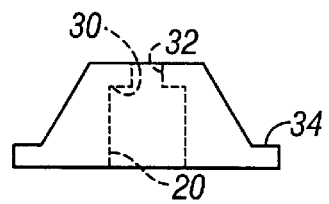
FIG. 6A    FIG. 6B    FIG. 6C

MICROMACHINED FLUIDIC COUPLER AND METHOD OF MAKING THE SAME

RELATED APPLICATIONS

The present application is a Divisional of Ser. No. 09/516,487 filed on Mar. 1, 2000 now U.S. Pat. No. 6,428,053 and related to U.S. Provisional Patent Application Ser. No. 60/124,244 filed on Mar. 12, 1999.

BACKGROUND OF THE INVENTION

1. Field of the Invention

The invention relates to the field of fluidics and in particular to coupling devices used in microfluidic circuits.

2. Description of the Prior Art

Rapidly developing Micro Electro Mechanical Systems (MEMS) technology makes micro fluidic systems very attractive for many applications, such as micro heat exchangers, micro chromatographs, biochemical detectors, micro mass spectrometers, micro reactors, and micro fluid control systems (e.g., microchannels, micro valves, micro pumps, and micro flow meters). It is quite challenging to transfer fluids between a micro fluidic system and its macroscopic environment because of micron-scale dimensions. There is no effective and simple way to apply conventional fluidic couplers to microscale fluidic systems at this time. Currently, to achieve coupling, a tube with an inside diameter significantly larger than the size of the inlet or outlet is directly glued to the opening. The yield of this approach is usually very low due to tube misalignment and inlet or outlet blockage by excessive glue. In addition, the permissible number of couplings for a micro fluidic system is limited by the relatively large size of the tubing used, and may not be adequate for the system. Furthermore, such a coupling generally cannot withstand high pressures required in many applications.

In order to adapt to the rapidly growing demand for micro fluidic systems, a novel, low-cost, and highly reliable coupling technique is required. The micromachined fluidic couplers proposed and developed at the Caltech Micromachining Laboratory can fulfill this requirement.

BRIEF SUMMARY OF THE INVENTION

The invention comprises a micromachined coupler for coupling a capillary having a first size to an orifice having a shape and a second size. The invention in particular comprises a substrate, and a cavity defined in the substrate defining the orifice. A body is provide which has a shape conforming the shape of the cavity. A through hole is defined through the body. The through hole has a size conforming to the first size of the capillary. The capillary is disposable into the through hole so that the capillary of the first size is coupled to the orifice of the second size without the first and second sizes necessarily being the same.

The cavity and the body have conforming slanting surfaces, and in particular the cavity and the body define truncated pyramidal shapes. The cavity and the body each have a truncated square pyramidal shape, a truncated triangular pyramidal shape, or a truncated conical shape.

The micromachined coupler may further comprise a tubing stopper defined in the through hole and/or a shoulder defined on a surface of the coupler for bonding to the substrate outside of the cavity.

Typically the size of the orifice is different than the size of the capillary.

The invention is also characterized as a method of fabricating a micromachined coupler for coupling a capillary having a first size to an orifice having a shape and a second size comprising the steps of masking a substrate from which will a body of the micromachined coupler will be formed. The masking forms a pattern to define a pyramidal structure in the substrate. The masked substrate is anisotropically etched to form the pyramidal structure including a pit in the pyramidal structure. A surface of substrate opposite the pyramidal structure is then provided with a patterned mask. A prismatic hole is defined through the substrate and communicated with the pit to provide a through hole through the substrate.

The step of anisotropically etching the masked substrate to form the pyramidal structure forms a simple truncated structure or a truncated structure with a basal shoulder.

In one embodiment the step of defining a prismatic hole through the substrate does not completely remove the pit so that a tubing stop is formed by a remaining portion of the pit. The method further comprises the step of disposing a capillary into the prismatic hole in a sealed relationship therewith.

The step of anisotropically etching the masked substrate to form the pyramidal structure forms a square, triangular or conical truncated structure.

The invention is still further defined as a method of fabricating a micromachined coupler for coupling a capillary having a first size to an orifice having a shape and a second size comprising the steps of defining a truncated pyramidal cavity in a micromachined mold. A material is disposed or deposited in the truncated pyramidal cavity to form a body of the coupler. A prismatic hole of a first size is defined through the body to define a through hole by deep reactive ion etching.

In another embodiment the method further comprises the step of defining by deep reactive ion etching a prismatic hole of a second size in the body aligned with the prismatic hole of the first size to define a tubing stop in the prismatic hole of the first size.

The invention now having been briefly summarized, turn to the following drawings wherein the invention may be better visualized and where like elements are reference by like numerals.

BRIEF DESCRIPTION OF THE DRAWINGS

FIG. 3b is a cross-sectional view of the pit of FIG. 3a as seen through lines 3—3 of FIG. 3a.

FIGS. 5a and 5b cross-sectional diagrammatic side views of the coupler of the invention fitted into inlets/outlets of different diameters or sizes.

FIGS. 6a and 6a' are the side cross-sectional view and top plan view respectively of a first embodiment of the coupler.

FIGS. 6b and 6b' are the side cross-sectional view and top plan view respectively of a second embodiment of the coupler.

FIGS. 6c and 6c' are the side cross-sectional view and top plan view respectively of a third embodiment of the coupler.

The invention and various ones of its embodiments now having been illustrated in the above drawings, turn to the following detailed description of the preferred embodiments.

DETAILED DESCRIPTION OF THE PREFERRED EMBODIMENTS

Micro fluidic couplers based on micromachining technology have been developed in the Caltech Micromachining Laboratory. By using the uniquely designed couplers, it is possible to easily align capillaries of different sizes to the inlet or outlet of a micro fluidic system. The couplers are strongly bonded directly to a fluidic system. For example, a thin layer of bonding material is applied between the mating surfaces. This coupling technique requires minimal preparation time and is low in complexity, yet provides a robust and high yield interconnect for micro fluidic systems. In addition, the fabrication cost for the couplers is inexpensive because of batch processing.

Figure 1:
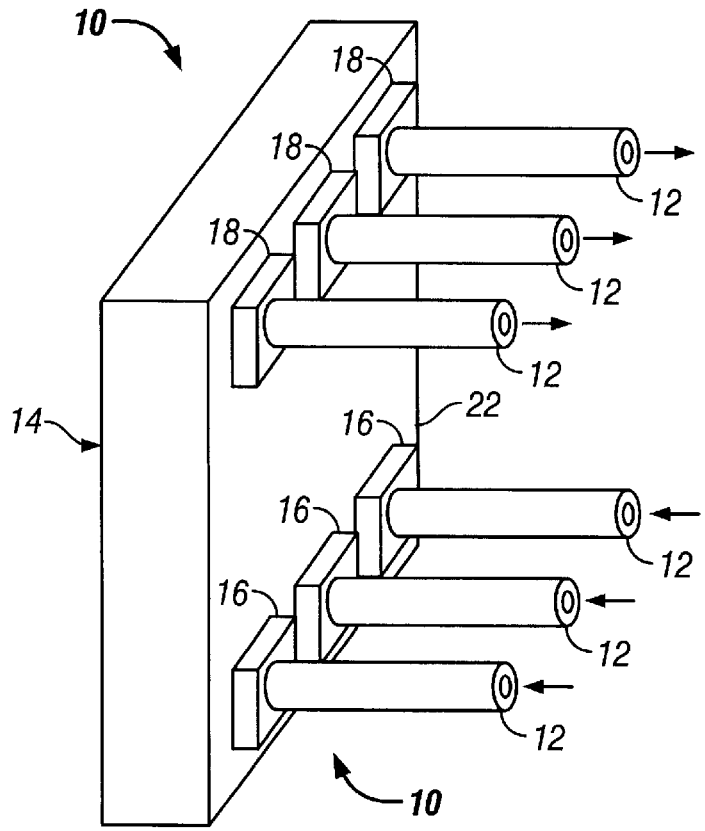
FIG. 1 is a diagrammatic perspective view of a microfluidic system coupled with capillaries by means of micromachined fluidic couplers.
Figure 2:
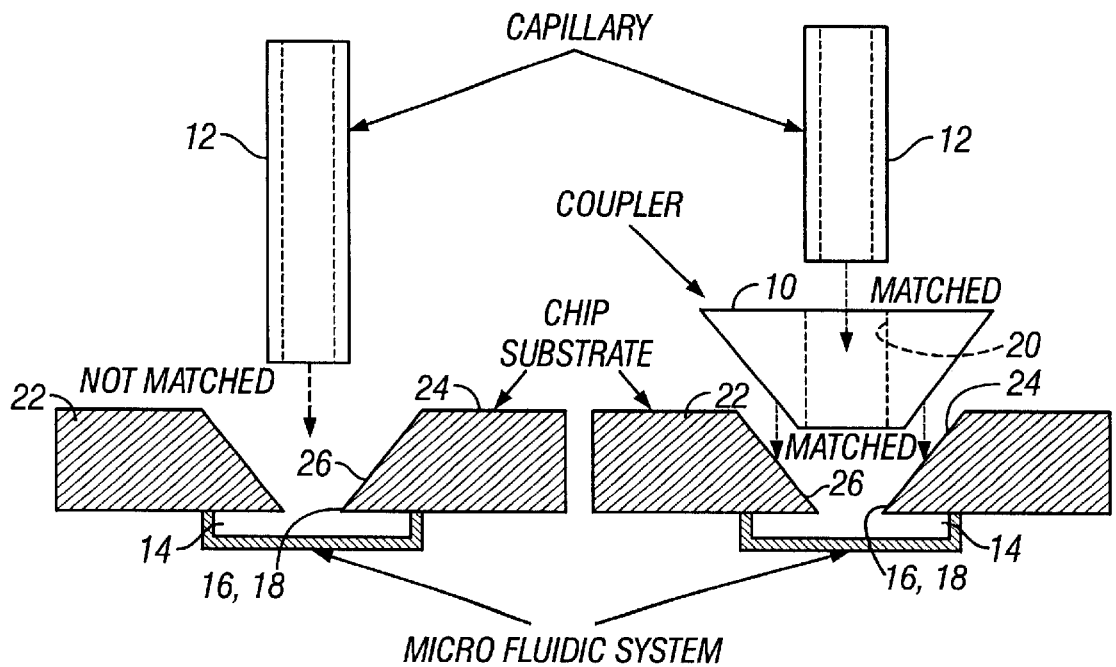
FIG. 2 is a diagrammatic side cross-sectional view of a coupling of a capillary to the microfluidic system according to the invention as shown in the right side of the drawing and as shown in a conventional coupling without the benefit of the coupler of the invention in the left half of the drawing.

Micromachined fluidic couplers 10 are used to connect fluidic capillaries 12 to a microfluidic system 14 with inlets 16 and outlets 18, hidden from view by couplers 10 in the depiction of FIG. 1, but explicitly shown in FIG. 2, that may differ from the capillaries 12 in both shape and size. By using such couplers 10, a fluidic interconnection with multiple channels is built for the microfluidic system 14 as shown in the diagrammatic perspective view FIG. 1.

In general, it is impractical to connect a fluidic capillary 12 directly to the inlet 16 or outlet 18 due to their different shapes and sizes. An intermediate object, i.e. a micromachined coupler 10, must be introduced to achieve such a coupling. The coupler 10 is designed in such a way that a capillary 12 can be tightly placed into the size-matched hole 20 in the center of the coupler 10 and the coupler 10 can be conformably fitted into the size-matched inlet 16 or outlet 18 defined in substrate 22 as shown in the right half of FIG. 2.

Figure 3A:
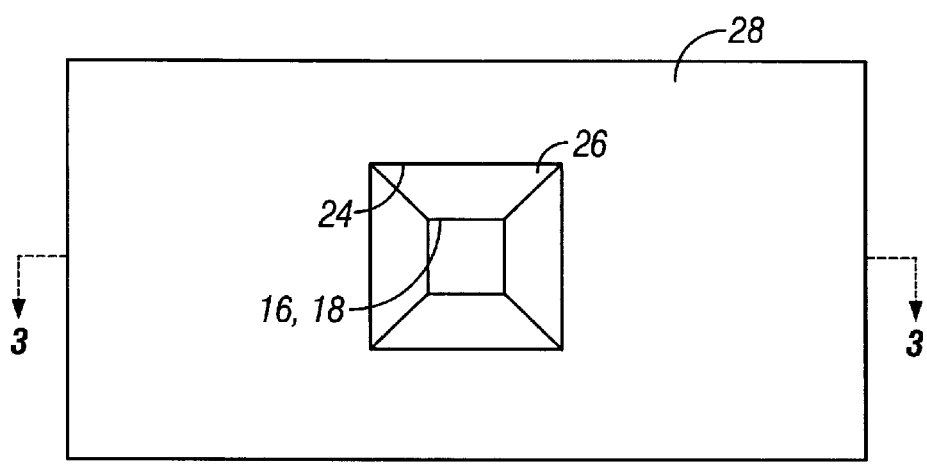
FIG. 3a is a plan top view of a single inlet or outlet pit shown in enlarged scale.
Figure 3B:
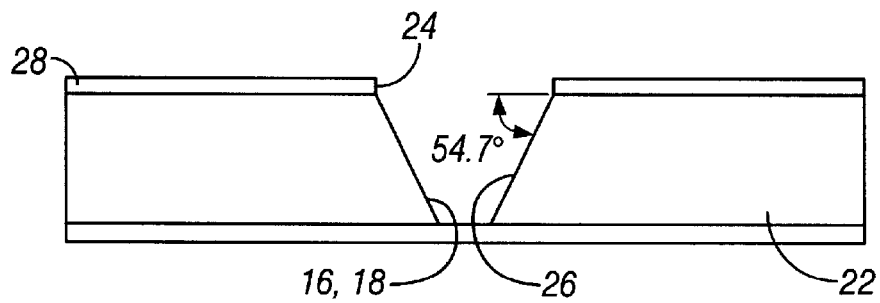
Figure 4:
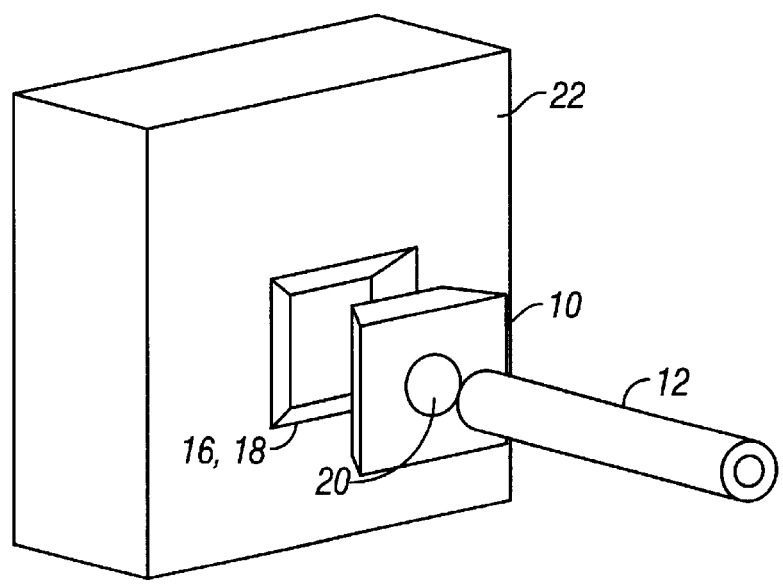
FIG. 4 is a three-quarter perspective, exploded view of the coupler of the invention shown in combination with the outlet/inlet of the fluidic system and capillary.

For example, the inlets 16 and outlets 18 in a fluidic system 14 built on a silicon chip or substrate 22 are the pits 26 usually etched into (100) silicon with an anisotropic wet etch (i.e. KOH, TMAH and EDP) through square openings 24 in the etching mask 28 as shown in FIGS. 3a and 3b. Such a pit 26 has the pyramidal shape bonded by four (111) planes as shown in FIGS. 3a and 3b, and there is yet no effective way to connect a capillary directly to such an inlet 16 or outlet 18. However, a coupler 10 with the truncated pyramidal shape bonded by four (111) side walls can now be applied to make such a connection as shown in FIG. 4. With the similar pyramidal shape formed by an anisotropic wet etching, the coupler 10 can be conformably fitted into the inlet 16 or outlet 18. A capillary 12 can be placed tightly in the size-matched hole 20 etched in the center of the coupler 10 using deep reactive ion etching (DRIE). Later capillary 12 and coupler 10 can be firmly bonded together by various bonding techniques, such as gluing, polymer film bonding, indium solder bonding, or Au eutectic bonding.

Also, as shown in FIGS. 5a and 5b, a single coupler 10 can be used for an inlet 16 or outlet 18 with various diameters by a variable fitting depth inherent in the design of coupler 10.

Another embodiment of the invention is realized in a truncated pyramidal coupler 10 as shown in FIGS. 6a, 6b and 6c and FIGS. 6a', 6b' and 6c'. FIGS. 6a and 6a' as mentioned before show the simplest design in which a single through hole 20 on the axis of symmetry of the truncated pyramidal shape is provided. The embodiment of FIGS. 6b and 6b' have the same outside shape as coupler 10 of FIG. 6a and 6a', but has a tubing stopper 30 inside hole 20 defined as lower circumferential lip in which a hole 32 is defined which has a smaller diameter than hole 20 through the body of coupler 10. FIGS. 6c and 6c' depict a third embodiment which has a shoulder 34, which can be bonded to the chip substrate 22 of the micro fluidic system 14 to secure the coupling thereto.

Figure 7:
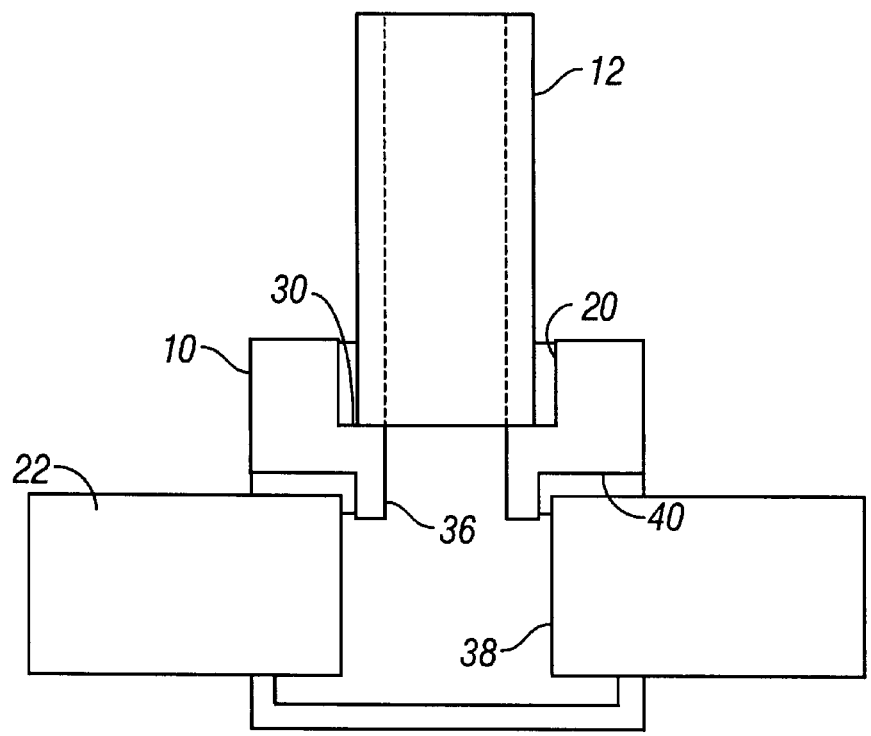
FIG. 7 is a diagrammatic side cross-sectional view of still another embodiment of the coupler.

The micromachined fluidic couplers 10 can be made for inlets 16 and outlets 18 with many other shapes. As shown in FIG. 7, an alignment post 36 made in the same shape as the inlet 16 or outlet 18 can be fitted into the opening 38, and the adjacent, large flat bonding area 40 can be bonded to the chip substrate 22 of the micro fluidic system 14. As discussed before, the capillary tubing 12 can be put into the center hole 20 and then bonded to the coupler 10. A stopper 30 is illustrated in FIG. 7, but may be eliminated if desired.

With micromachined couplers 10, the coupling process becomes less complicated. First, by using the uniquely designed micromachined couplers 10, small capillaries 12 are easily aligned with the inlets 16 and outlets 18 of a micro fluidic system 14. Second, by coating a thin layer of bonding material on the surfaces of coupler 10, micromachined coupler 10 can readily be bonded to a fluidic system 14. Third, by applying existing bonding techniques such as gluing, polymer film bonding, indium solder bonding, or Au eutectic bonding, a strong coupling can be formed between capillaries 12 and the micro fluidic system 14. Therefore, this coupling process can provide robust, high-yield fluidic interconnection with minimal preparation time and complexity.

The micromachined fluidic couplers 10 can be made from different materials (i.e. silicon, metal, and even polymers) that are employed in microfabrication processes By using a batch micromachining process, a large quantity of couplers 10 can be fabricated in a single manufacturing run. Truncated couplers 10 of FIGS. 6a, 6b and 6c are designed for the inlet/outlet pits 26 formed by silicon anisotropic wet etching. Post couplers 10 of FIG. 7 are designed for the inlet/outlet pits 26 with any other shapes such as circular pits, rectangular pits, or even triangular pits. Alignment post 36 is manufactured to have a conforming shape to that of the circular pits, rectangular pits, or even triangular pit.

Consider now the method of manufacture of a silicon truncated pyramidal coupler 10 as shown in FIGS. 6c and 6c'. A similar manufacturing process can be used to fabricate the other described embodiments. Silicon truncated pyramidal coupler 10 is fabricated by standard silicon anisotropic wet etching and deep reactive ion etching (DRIE). The process flow is shown in FIGS. 8a, 8b, 8c and 8d. Starting with a <100> silicon prime wafer 22, a patterned layer of mask material 28 is grown for the following silicon anisotropic wet etch and DRIE. By using a silicon anisotropic wet etch a pyramidal island 42 with a small pit 44 in the center is created on the front side of the wafer 22. By DRE on the backside 48 of the wafer 22, a circular pit 20 is etched all the way through to meet the pit 44 on the front side to define hole 32 and stopper 30. Masking layer 28 is removed. A layer of bonding material is coated before or after the DRE step of FIG. 8c. A capillary tube 12, coated with a thin layer of bonding material, is placed in the size-matched hole 20 and bonded to the coupler 10.

Figure 9:
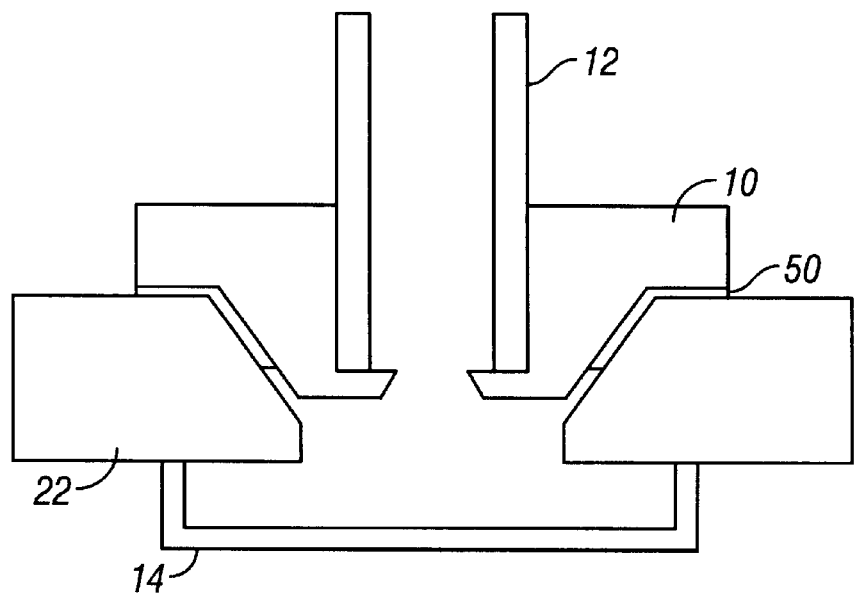
FIG. 9 is a side cross-sectional view of a coupler of the embodiment of FIGS. 6c and 6c' shown bonded to a substrate through a bonding layer.
Figure 8A:
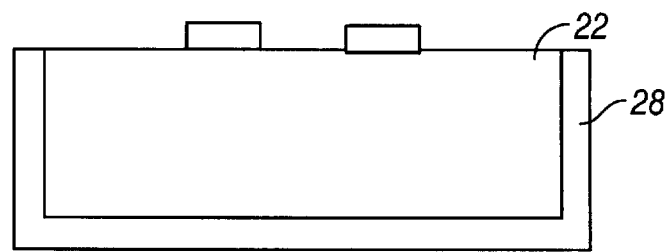
FIGS. 8a, 8b, 8c and 8d are cross-sectional side views of the invention illustrating the fabrication of the embodiment of FIGS. 6c and 6c'.
Figure 8B:
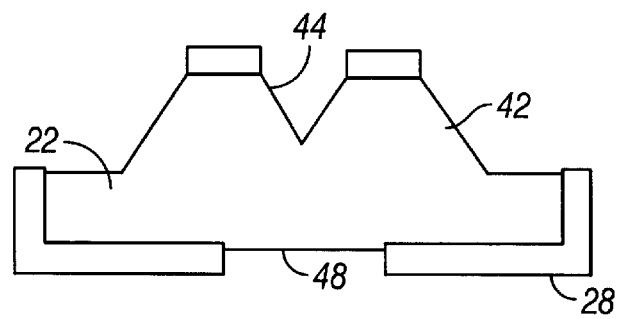
Figure 8C:
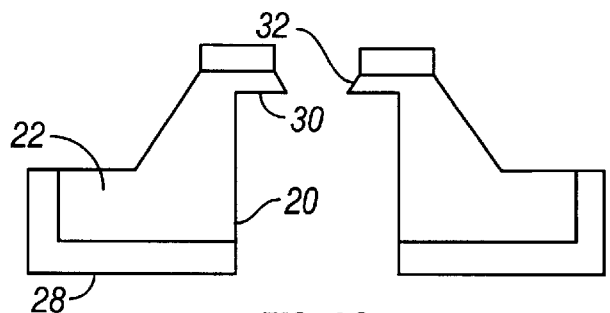
Figure 8D:
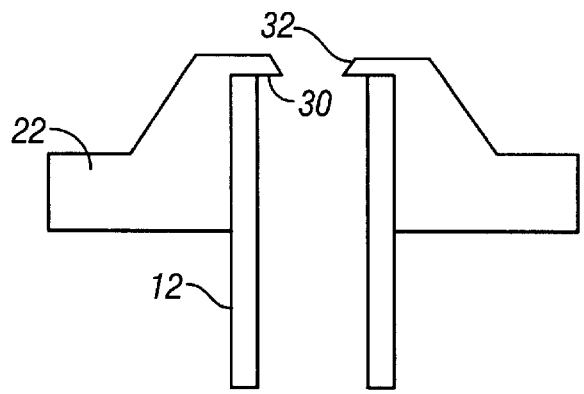
Figure 10A:
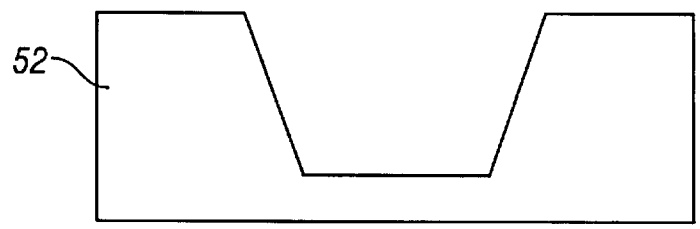
FIGS. 10a, 10b, 10c and 10d illustrate the fabrication steps of molding a coupler.
Figure 10B:
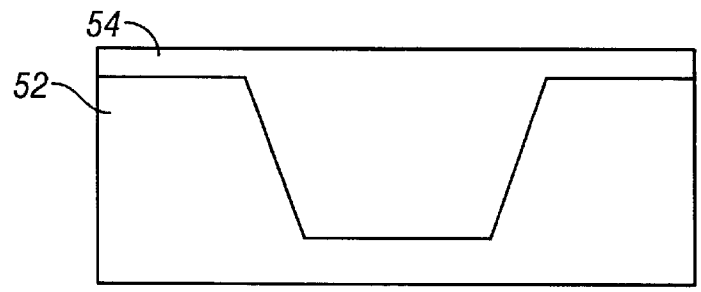
Figure 10C:
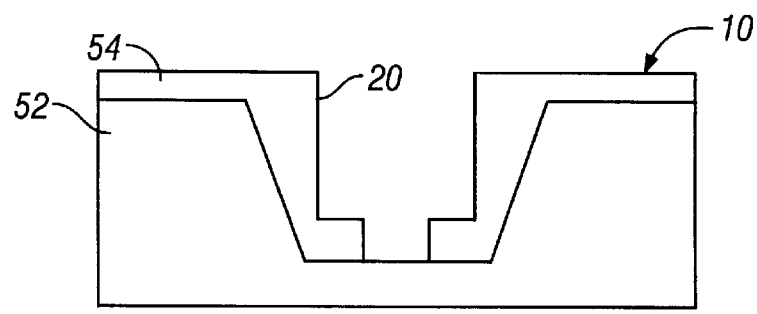
Figure 10D:
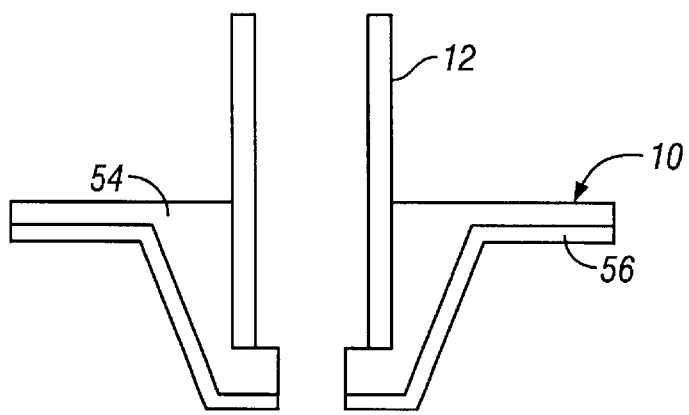

By using the truncated pyramidal silicon couplers 10, robust, high-yield fluidic interconnection can be easily established. The coupling can be self-aligned by fitting the truncated pyramidal couplers into the shape-matched inlet/outlet pits 26 created by anisotropic etching as shown in FIG. 9. With a thin layer 50 of bonding material coated on the surfaces, existing bonding techniques (such as gluing, indium solder bonding, or Si—Au eutectic bonding) can be used to bond the couplers 10 to a fluidic system 14. Strong coupling can be achieved, which allows for high pressures. In addition, the self-aligning feature leads to a high-yield coupling.

The truncated pyramidal coupler 10 can also be molded with other materials such plastic, indium solder, and electroplated metals. First, the mold is fabricated on a silicon wafer 52 by an anisotropic wet etch . Then the body 54 truncated pyramidal-shape coupler 10 is molded or electroplated in the silicon mold 52. Later, the center pit 20 is made by electrode discharge machining (EDM), laser drilling or mechanical drilling. After releasing from the silicon mold 52, a layer 56 of bonding material is coated on the surface of the coupler 10. Finally, a capillary tube 12, coated with a thin layer of glue, is placed in the size-matched hole 20 to bond to the coupler 10.

Figure 11:
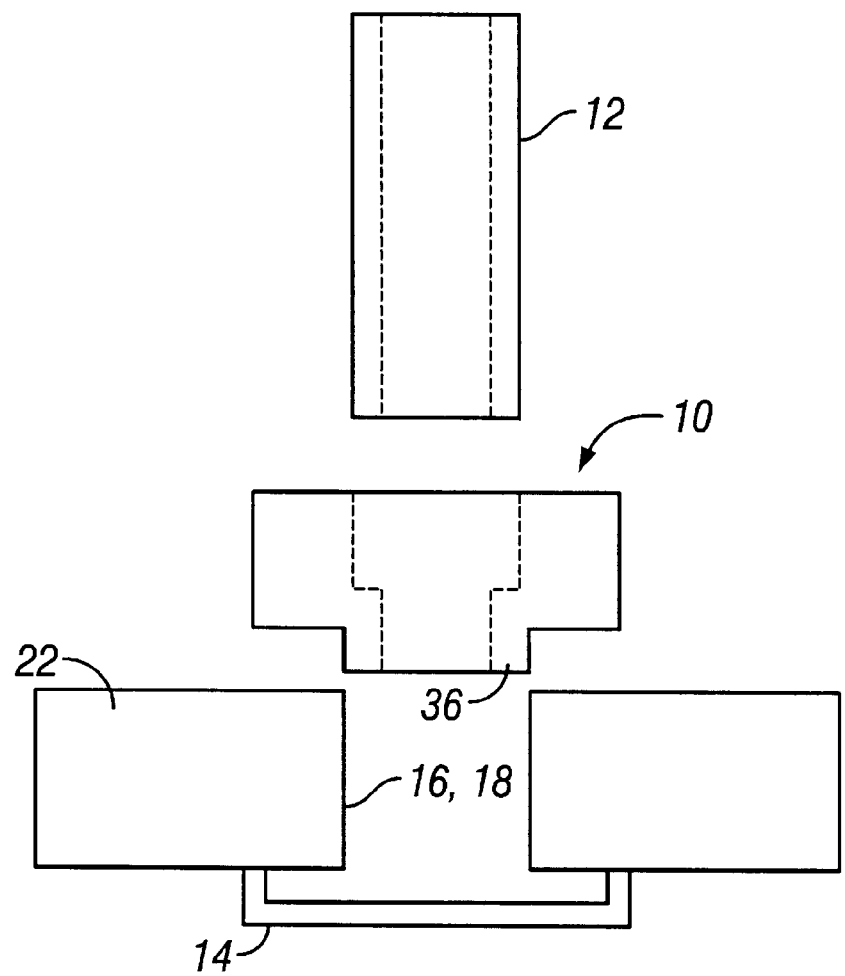
FIG. 11 is a side cross-sectional view which shows the coupler of FIG. 7 fitted to a microfluidic system with small straight inlets and outlets.

Post couplers 10 of FIG. 7 are designed for a microfluidic system 14 with small straight inlets and outlets shown in FIG. 11. By inserting the alignment post 36 into an inlet 16 or outlet 18 of matching size, the coupler 10 and tubing 12 are automatically aligned to the inlet/outlet 16/18. With the strong bond formed by the bonding material and large bonding surface, the coupling can withstand very high pressures.

Figure 12A:
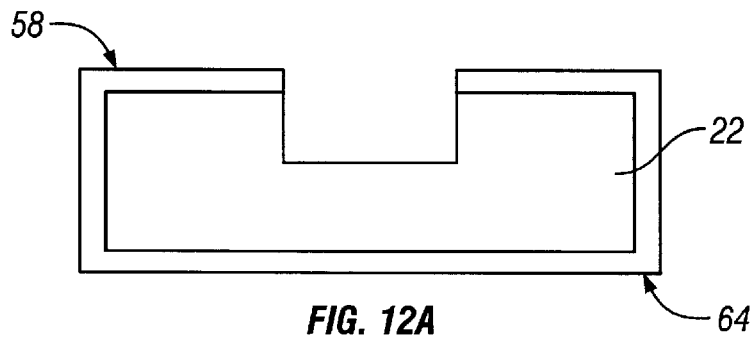
FIGS. 12a, 12b, 12c and 12d are side cross-sectional views which illustrate the fabrication of a coupler of FIG. 7.
Figure 12B:
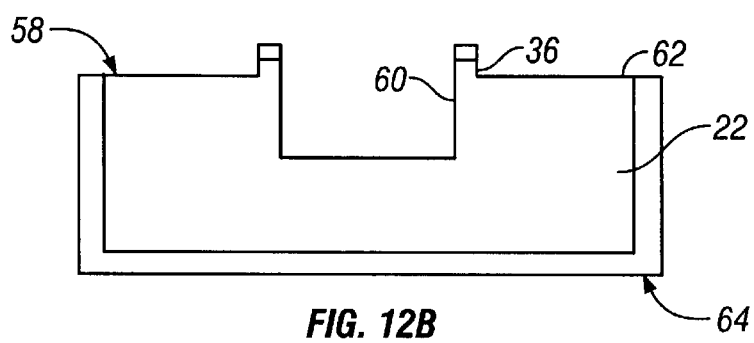
Figure 12C:
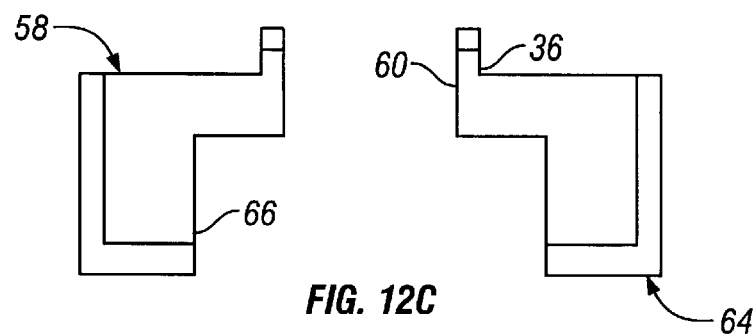
Figure 12D:
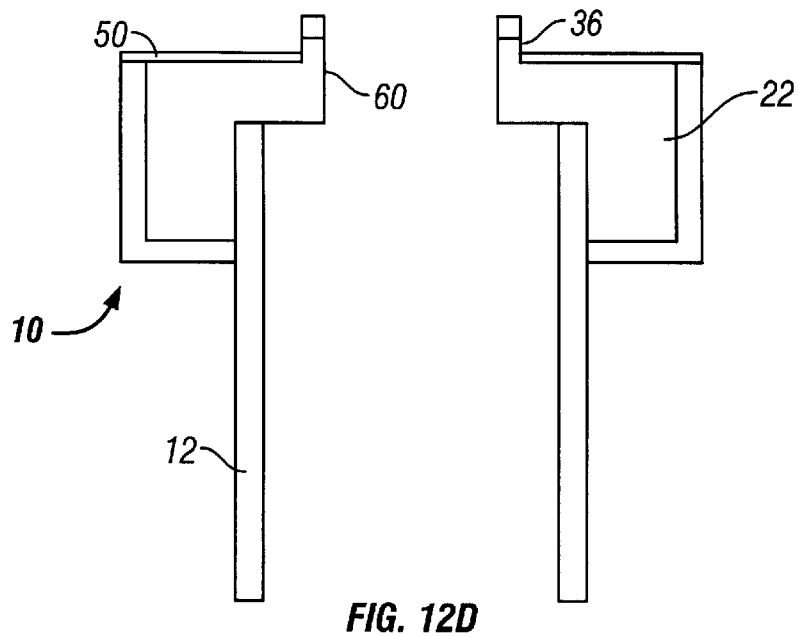

Post coupler 10 is fabricated on a silicon wafer 22 by etching three times via DRIE. The process flow is shown in FIGS. 12a, . Starting from a flat wafer 22 in FIG. 12a, a 200 to 300 µm deep pit 60 is etched on the front side 58, and then an 50 to 100 µm high alignment post 36 is masked and formed on the front side by etching down the unmasked area 62 as shown in FIG. 12b. The post 36 is designed such that its size closely matches that of the inlets/outlets 16/18. On the backside 64, a pit 66 is etched down all the way to meet pit 60 through front side 58 as shown in FIG. 12c. The size of the pit 66 on the backside 64 is chosen to closely match the size of the tubing 12. After coating with a bonding layer, a tube 12 is inserted into the pit 66 through the backside 64 and then bonded to the coupler 10 as shown in FIG. 12d.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A micromachined coupler for coupling a capillary having a first size to an orifice having a shape and a second size comprising:
   a substrate;
   a cavity defined in said substrate defining said orifice;
   a body having a shape conforming said shape of said cavity; and
   a through hole defined through said body having a size conforming to said first size of said capillary, said capillary being disposable into said through hole so that said capillary of said first size is coupled to said orifice of said second size without said first and second sizes being the same.

2. The micromachined coupler of claim 1 wherein said cavity and said body have conforming slanting surfaces.

3. The micromachined coupler of claim 1 wherein said cavity and said body define truncated pyramidal shapes.

4. The micromachined coupler of claim 3 wherein said cavity and said body define truncated square pyramidal shapes.

5. The micromachined coupler of claim 3 wherein said cavity and said body define truncated triangular pyramidal shapes.

6. The micromachined coupler of claim 1 wherein said cavity and said body define truncated conical shapes.

7. The micromachined coupler of claim 1 further comprising a tubing stopper defined in said through hole.

8. The micromachined coupler of claim 1 wherein said size of said orifice is different than said size of said capillary.

9. A method of fabricating a micromachined coupler for coupling a capillary having a first size to an orifice having a shape and a second size comprising:

masking a substrate from which a body of said micromachined coupler will be formed said masking forming a pattern to define a pyramidal structure in said substrate;

anisotropically etching said masked substrate to form said pyramidal structure including a pit in said pyramidal structure;

masking a surface of substrate opposing said pyramidal structure; and defining a prismatic hole through said substrate and communicating with said pit to provide a through hole through said substrate.

where anisotropically etching said masked substrate to form said pyramidal structure forms a simple truncated structure.

10. A method of fabricating a micromachined coupler for coupling a capillary having a first size to an orifice having a shape and a second size comprising:

masking a substrate from which a body of said micromachined coupler will be formed, said masking forming a pattern to define a pyramidal structure in said substrate;

anisotropically etching said masked substrate to form said pyramidal structure including a pit in said pyramidal structure;

masking a surface of substrate opposing said pyramidal structure;

defining a prismatic hole through said substrate and communicating with said pit to provide a through hole through said substrate; and disposing a capillary into said prismatic hole in a sealed relationship therewith.

11. A method of fabricating a micromachined coupler for coupling a capillary having a first size to an orifice having a shape and a second size comprising:

masking a substrate from which a body of said micromachined coupler will be formed, said masking forming a pattern to define a pyramidal structure in said substrate;

anisotropically etching said masked substrate to form said pyramidal structure including a pit in said pyramidal structure;

masking a surface of substrate opposing said pyramidal structure; and defining a prismatic hole through said substrate and communicating with said pit to provide a through hole through said substrate, where anisotropically etching said masked substrate to form said pyramidal structure forms a square truncated structure.

12. A method of fabricating a micromachined coupler for coupling a capillary having a first size to an orifice having a shape and a second size comprising:

masking a substrate from which a body of said micromachined coupler will be formed, said masking forming a pattern to define a pyramidal structure in said substrate;

anisotropically etching said masked substrate to form said pyramidal structure including a pit in said pyramidal structure;

masking a surface of substrate opposing said pyramidal structure; and defining a prismatic hole through said substrate and communicating with said pit to provide a through hole through said substrate, where anisotropically etching said masked substrate to form said pyramidal structure forms a triangular truncated structure.

13. A method of fabricating a micromachined coupler for coupling a capillary having a first size to an orifice having a shape and a second size comprising:

masking a substrate from which a body of said micromachined coupler will be formed, said masking forming a pattern to define a pyramidal structure in said substrate;

anisotropically etching said masked substrate to form said pyramidal structure including a pit in said pyramidal structure;

masking a surface of substrate opposing said pyramidal structure; and defining a prismatic hole through said substrate and communicating with said pit to provide a through hole through said substrate, where anisotropically etching said masked substrate to form said pyramidal structure forms a conical truncated structure.

14. A micromachined coupler for coupling a capillary having a first size to an orifice having a shape and a second size comprising:

a substrate;

a cavity defined in said substrate defining said orifice;

a micromachined body having a shape conforming said shape of said cavity; and a micromachined through hole defined through said body having a size conforming to said first size of said capillary, said capillary being disposed into said through hole so that said capillary of said first size is coupled to said orifice of said second size wherein said first and second sizes are not the same.

* * * * *